US 7,548,485 B2

(12) United States Patent
Kim et al.

(10) Patent No.: US 7,548,485 B2
(45) Date of Patent: Jun. 16, 2009

(54) SEMICONDUCTOR MEMORY DEVICE CAPABLE OF SYNCHRONOUS/ASYNCHRONOUS OPERATION AND DATA INPUT/OUTPUT METHOD THEREOF

(75) Inventors: Young-Seung Kim, Seodaemun-gu (KR); Chul-Sung Park, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 11/845,191

(22) Filed: Aug. 27, 2007

(65) Prior Publication Data
US 2008/0165610 A1    Jul. 10, 2008

(30) Foreign Application Priority Data
Jan. 8, 2007    (KR) ............... 10-2007-0001970

(51) Int. Cl.
*G11C 8/02* (2006.01)
(52) U.S. Cl. ............... 365/233.1; 365/189.08; 365/233.19
(58) Field of Classification Search ............ 365/189.01, 365/189.08, 189.14, 189.19, 233.1, 233.16, 365/233.17, 233.19
See application file for complete search history.

(56) References Cited
U.S. PATENT DOCUMENTS 6,058,063 A * 5/2000 Jang ............... 365/189.05
6,934,216 B2 * 8/2005 Mori ............... 365/233.11
6,977,865 B2   12/2005 Jeong
7,336,557 B2 *  2/2008 Sawada ............... 365/233.1
2002/0181301 A1 * 12/2002 Takahashi et al. ........... 365/200
2003/0035335 A1 *  2/2003 Kawaguchi et al. ......... 365/222
2005/0226090 A1   10/2005 Lee
2006/0179260 A1    8/2006 Yoon

FOREIGN PATENT DOCUMENTS

JP    2005302252 A    10/2005
KR    100521048 B1    10/2005
KR    1020050100262 A 10/2005
KR    100585179       5/2006

* cited by examiner

*Primary Examiner*—Tuan T Nguyen
*Assistant Examiner*—Hien N Nguyen
(74) *Attorney, Agent, or Firm*—Volentine & Whitt, P.L.L.C.

(57) ABSTRACT

A semiconductor memory device capable of synchronous/asynchronous operation and data input/output method thereof are provided. The semiconductor memory device includes a memory cell array, a peripheral circuit configured to write data to a cell in the memory cell array and to read data from the cell, and a bypass control unit configured to control a late write operation and a bypass operation of the peripheral circuit according to mode conversion of the semiconductor memory device. Accordingly, data coherency can be maintained. In addition, dummy cycle time that may occur during the mode conversion can be prevented by generating a mode conversion signal only in response to toggling of a clock signal.

18 Claims, 8 Drawing Sheets

SEMICONDUCTOR MEMORY DEVICE CAPABLE OF SYNCHRONOUS/ASYNCHRONOUS OPERATION AND DATA INPUT/OUTPUT METHOD THEREOF

CROSS-REFERENCE TO RELATED PATENT APPLICATION

This application claims priority under 35 U.S.C. § 119 from Korean Patent Application No. 10-2007-0001970, filed on Jan. 8, 2007, the disclosure of which is hereby incorporated by reference herein as if set forth in its entirety.

BACKGROUND OF THE INVENTION

1. Field of the Invention

The present invention relates to a semiconductor memory device, and more particularly, to a semiconductor memory device capable of synchronous/asynchronous operation and data input/output method thereof.

2. Description of Related Art

Static Random Access Memory (SRAM) devices contain flip-flop memory cells. SRAM essentially works on the principle of a switch. An advantage of SRAM devices is that they do not require a refresh clock; the data is maintained by the switches so long as power is supplied. But SRAM devices need a lot of transistors for the memory cells (typically 2-4 transistors per bit), and therefore, they are relatively expensive and provide for a relatively low density of integration. By contrast, Dynamic Random Access Memory (DRAM) devices are relatively cheaper and have a simpler cell structure than SRAM devices (typically 1 transistor per bit). DRAM devices use capacitors to store charge. Due to leakage of the charge, DRAM cells require periodic refresh operations to maintain stored data.

A pseudo SRAM (PSRAM) device implements the operation of an SRAM device using DRAM cells. The PSRAM device can operate in a combined mode in which the PSRAM device operates in an asynchronous mode like an SRAM device and also operates in a synchronous mode like a DRAM device.

When a write command is generated in the asynchronous mode, a conventional PSRAM device stores an address and data input together with the write command in a register during a write command generation period and writes the data stored in the register to a corresponding memory cell during a subsequent write period in a late write operation. In addition, when a read command is generated in the asynchronous or synchronous mode, the conventional PSRAM reads data from a register not from a memory cell in a bypass operation when an address input together with the read command is the same as an address stored in the register.

However, conventional semiconductor memory devices, e.g., conventional PSRAM devices, using both of the synchronous mode and the asynchronous mode may have a data coherency problem when the synchronous mode is converted into the asynchronous mode or when the asynchronous mode is converted into the synchronous mode. For instance, when conversion between the synchronous mode and the asynchronous mode is performed, if an address which is input together with a late write command input in the asynchronous mode is the same as an address which is input together with a write command input in the synchronous mode, a data value may change, causing the data coherency problem.

Moreover, when conversion between the synchronous mode and the asynchronous mode is performed in the conventional PSRAM devices, it takes time to identify the asynchronous mode or the synchronous mode, which may generate a dummy cycle time.

SUMMARY OF THE INVENTION

Some embodiments of the present invention provide a semiconductor memory device capable of maintaining data coherency in mode conversion and a data input/output method thereof.

Some embodiments of the present invention also provide a semiconductor memory device capable of generating a mode conversion signal according to toggling of a clock signal and a data input/output method thereof.

According to some embodiments of the present invention, there is provided a semiconductor memory device that operates in a first mode and a second mode, the semiconductor memory device including: a memory cell array comprising a plurality of memory cells arrayed in columns and rows in a matrix; a peripheral circuit coupled to the memory cell array and configured to write data to the memory cell array and to read data from the memory cell array; and a bypass control unit coupled to the peripheral unit, the bypass control unit configured to enable a late write operation and a bypass operation of the peripheral circuit when the semiconductor memory device operates in the first mode and to disable the late write operation and the bypass operation of the peripheral circuit when the semiconductor memory device operates in the second mode.

According to other embodiments of the present invention, there is provided a data input/output method of a semiconductor memory device. The data input/output method includes outputting a late write signal and a bypass control signal in response to a second mode write command signal, a first signal, and a clock signal, which are input in a second mode; and generating the bypass signal in response to the first signal and the bypass control signal. The late write signal may enable a late write operation when data is input. The bypass signal may enable a bypass operation when data is output. The first signal may be generated when a first address, which is input together with a write command in a first mode of the semiconductor memory device, is the same as a second address, which is input following the first address after the semiconductor memory device is converted to the second mode.

BRIEF DESCRIPTION OF THE DRAWINGS

The above and other features and advantages of the present invention will become more apparent by describing in detail exemplary embodiments thereof with reference to the attached drawings in which:

FIGS. 7(a) and (b) are circuit diagrams of inversion-delay circuit units according to some embodiments of the present invention.

DETAILED DESCRIPTION OF THE EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. As used herein, a "transit" refers to a transition or change from one operational mode or state to another.

Figure 1:
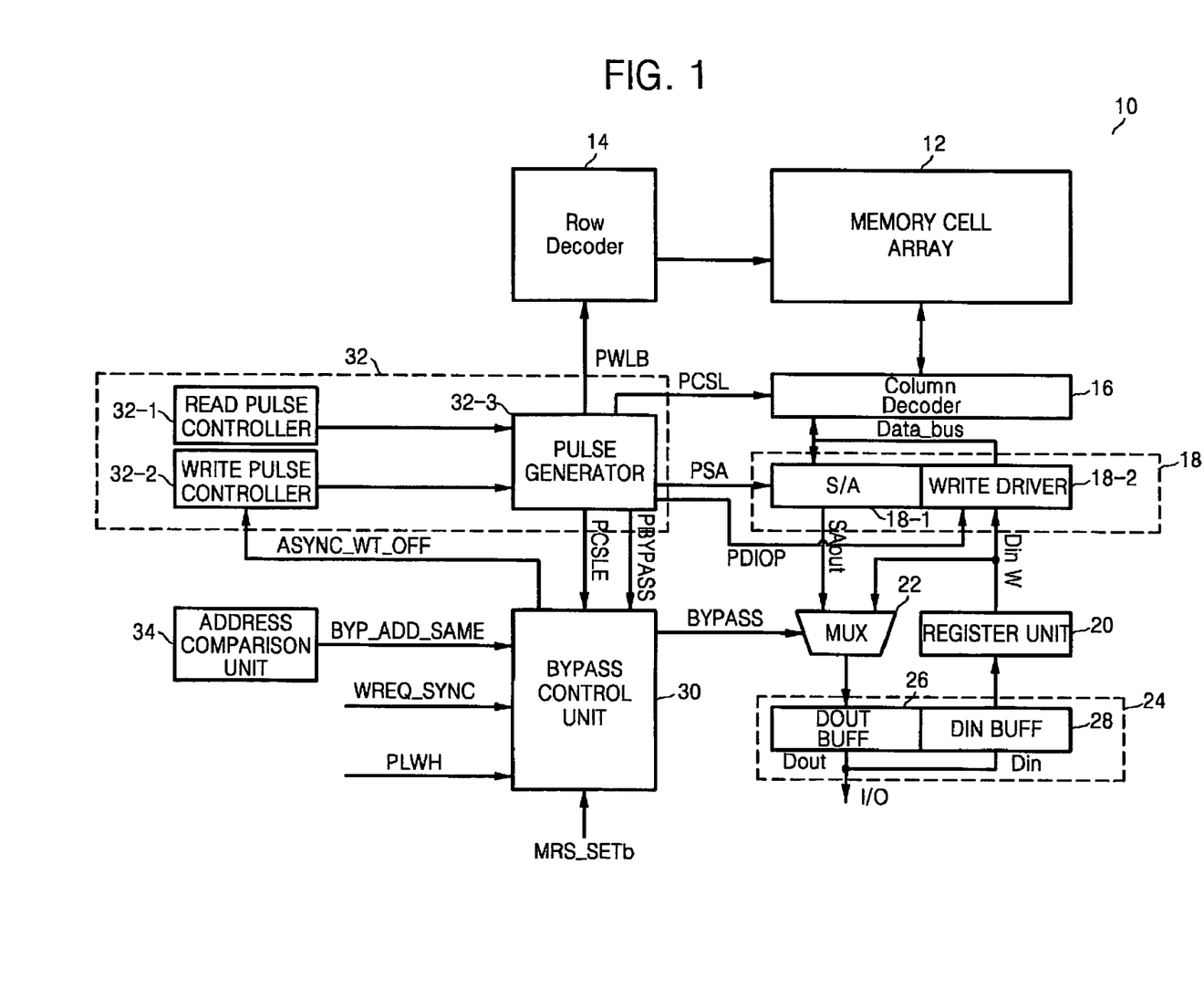
FIG. 1 is a functional block diagram of a semiconductor memory device according to some embodiments of the present invention.
Figure 2:
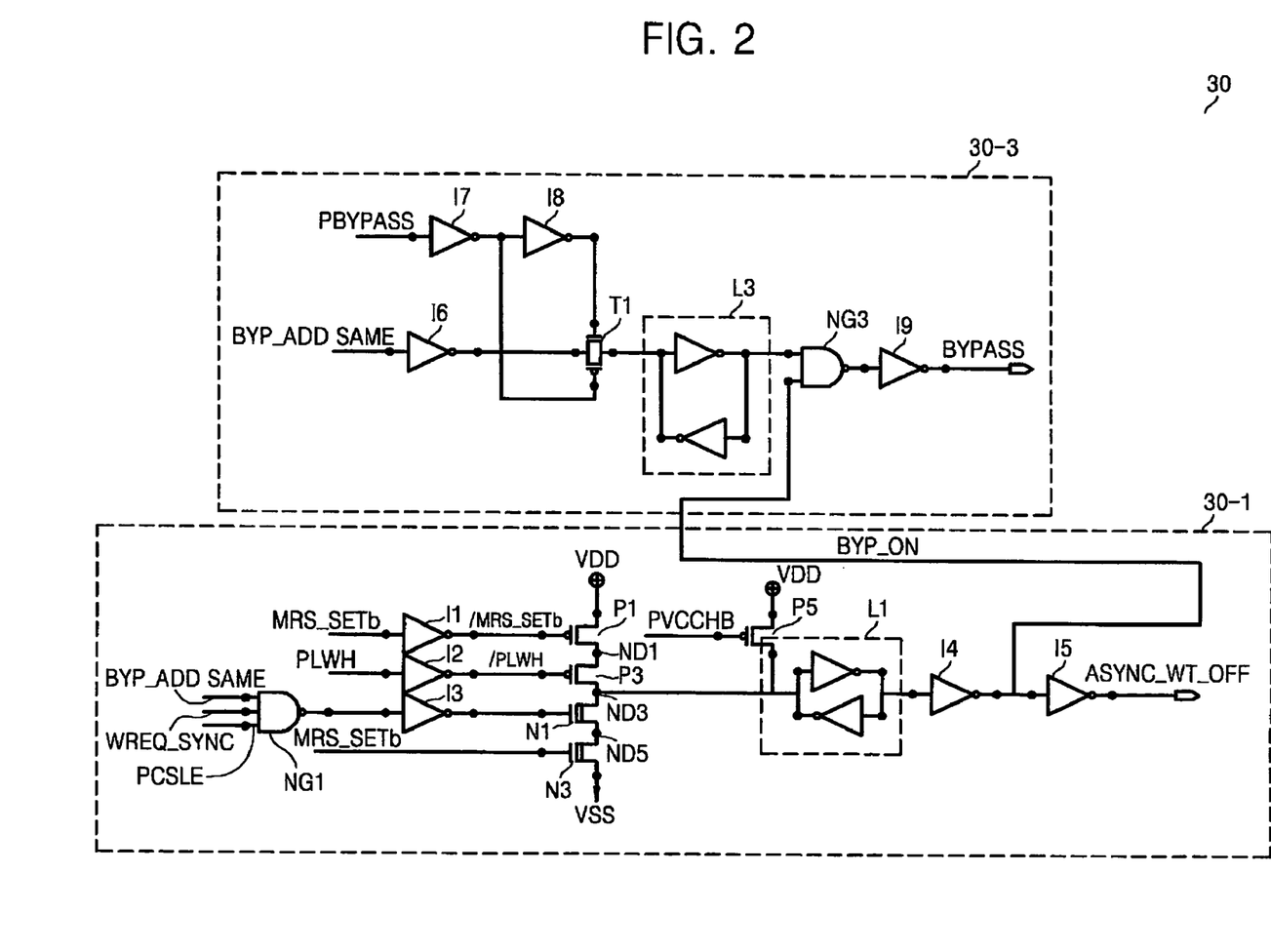
FIG. 2 is a circuit diagram of a bypass control unit illustrated in FIG. 1.

FIG. 1 is a functional block diagram of a semiconductor memory device 10 according to some embodiments of the present invention. FIG. 2 is a circuit diagram of a bypass control unit 30 illustrated in FIG. 1. Referring to FIGS. 1 and 2, the semiconductor memory device 10 includes a memory cell array 12, a peripheral circuit, and the bypass control unit 30.

The memory cell array 12 includes memory cells arrayed in columns and rows in a matrix. The peripheral circuit is needed to write data to or read data from a particular cell in the memory cell array 12 and includes a row decoder 14, a column decoder 16, a sensing/recording unit 18, a register unit 20, a selection unit 22, a data input/output unit 24, a pulse generation unit 32, and an address comparison unit 34.

The row decoder 14 selects a row in the memory cell array 12 based on a row address pulse signal PWLB input via the pulse generation unit 32. The column decoder 16 selects a row in the memory cell array 12 based on a column address pulse signal PCSL input via the pulse generation unit 32.

The sensing/recording unit 18 senses and amplifies first data in a memory cell selected by the row decoder 14 and the column decoder 16 in response to a second pulse signal PSA. In a first mode, the sensing/recording unit 18 stores second data stored in the register unit 20 in the selected memory cell in response to a first pulse signal PDIOP, which is generated by the pulse generation unit 32 in response to a late write signal ASYNC_WT_OFF enabling a late write operation. In a second mode, the sensing/recording unit 18 stores third data, which is input from an outside, in the selected memory cell regardless of the late write signal ASYNC_WT_OFF.

The sensing/recording unit 18 includes a sense amplifier (S/A) 18-1 and a write driver 18-2. The S/A 18-1 senses and amplifies the first data in the memory cell selected by the row decoder 14 and the column decoder 16. The write driver 18-2 stores the second data stored in the register unit 20 in the selected memory cell in response to the first pulse signal PDIOP, which is generated by the pulse generation unit 32 in response to the late write signal ASYNC_WT_OFF enabling the late write operation, in the first mode and stores the third data, which is input from the outside, in the selected memory cell in the second mode.

The register unit 20 stores the second data, which is input from an outside, when the semiconductor memory device 10 is in the first mode (e.g., an asynchronous mode).

The selection unit 22 selects and outputs either the second data stored in the register unit 20 or the first data output from the S/A 18-1 in response to a bypass signal BYPASS enabling a bypass operation.

The data input/output unit includes data output buffer (DOUT BUFF) 26 and data input buffer (DIN BUFF) 28. The data input/output unit 24 outputs data output from the selection unit 22 via the DOUT BUFF 26. In addition, the data input/output unit 24 transmits the second data or the third data, which is externally input, to the register unit 20 in the first mode and to the write driver 18-2 in the second mode via the DIN BUFF 28.

The pulse generation unit 32 generates the row address pulse signal PWLB, the column address pulse signal PCSL, the first pulse signal PDIOP, the second pulse signal PSA, a bypass path control signal PBYPASS, and a second mode core operation pulse signal PCSLE based on commands generated by a controller (not shown). The pulse generation unit 32 may include a read pulse controller 32-1, a write pulse controller 32-2, and a pulse generator 32-3.

The read pulse controller 32-1 outputs a read control signal for controlling the read operation of the S/A 18-1 based on a read command among the commands generated by the controller. The write pulse controller 32-2 outputs a write control signal for controlling the write operation of the write driver 18-2 based on a write command among the commands generated by the controller. The pulse generator 32-3 generates the row address pulse signal PWLB, the column address pulse signal PCSL, the first pulse signal PDIOP, the second pulse signal PSA, the bypass path control signal PBYPASS, and the second mode core operation pulse signal PCSLE based on the read control signal, the write control signal, and the commands received from the controller.

The address comparison unit 34 compares a first address, which is input together with the write command input when the semiconductor memory device 10 operates in the first mode (e.g., the asynchronous mode), with a second address, which is input following the first address after the semiconductor memory device 10 is converted into the second mode (e.g., the synchronous mode), and outputs a first signal BYP_ADD_SAME according to a result of the comparison. For instance, the address comparison unit 34 may output the first signal BYP_ADD_SAME at a first logic level (e.g., a high level) when the first address is the same as the second address and may output the first signal BYP_ADD_SAME at a second logic level (e.g., a low level) when the first address is not the same as the second address.

The bypass control unit 30 enables the late write operation and the bypass operation of the peripheral circuit when predetermined conditions are met in the first mode (e.g., the asynchronous mode) of the semiconductor memory device 10 and disables the late write operation and the bypass operation of the peripheral circuit when predetermined conditions are met in the second mode (e.g., the synchronous mode) of the semiconductor memory device 10. In the late write operation, an address and data input together with the write command are stored in the register unit 20 during a generation period of the write command and then the data stored in the register unit 20 is written to a memory cell in the memory cell array 12 during a subsequent write period. In the bypass operation, data is read from the register unit 20 rather than from a memory cell if an address input together with the read command is the same as an address stored in the register unit 20. As illustrated in FIG. 2, the bypass control unit 30 may include a late write signal generator 30-1 and a bypass signal generator 30-3.

In response to a second mode write command signal WREQ_SYNC, the second mode core operation pulse signal PCSLE, and the first signal BYP_ADD_SAME, which are input when the semiconductor memory device 10 is in the second mode, the late write signal generator 30-1 outputs a late write signal ASYNC_WT_OFF that is disabled and a bypass control signal BYP_ON that disables the bypass signal BYPASS. In response to a third pulse signal PLWH which is generated when a first write command ends after the semiconductor memory device 10 is converted from the second mode to the first mode, the late write signal generator 30-1 outputs the late write signal ASYNC_WT_OFF that is enabled and the bypass control signal BYP_ON that enables the bypass signal BYPASS.

Accordingly, since an address input together with a write command in the second mode is the same as an address input together with a late write command in the first mode when the semiconductor memory device 10 is converted from the second mode to the first mode, first mode late write is not needed. As a result, a first late write command after conversion into the first mode is not performed, and therefore, a data coherency problem in which a data value changes is prevented.

In addition, the late write signal generator 30-1 may also receive a mode conversion set signal MRS_SETb which is generated in case of the change of a mode resistor set (MRS) and output the late write signal ASYNC_WT_OFF and the bypass control signal BYP_ON in response to the second mode write command signal WREQ_SYNC, second mode core operation pulse signal PCSLE, the first signal BYP_ADD_SAME, and the mode conversion set signal MRS_SETb. The phase of the late write signal ASYNC_WT_OFF may be different from that of the bypass control signal BYP_ON by 180 degrees.

The late write signal generator 30-1 includes first through fifth transistors P1, P3, N1, N3, and P5, a first NAND gate NG1, first through fifth inverters I1 through I5, and a first latch circuit L1. The first transistor P1 is turned on or off in response to an inverted mode conversion set signal /MRS_SETb output from the first inverter I1, which inverts the mode conversion set signal MRS_SETb, thereby selectively forming an electrical path between a first power supply voltage VDD and a first node ND1. The second transistor P3 is turned on or off in response to an inverted third pulse signal /PLWH output from the second inverter I2, which inverts the third pulse signal PLWH, thereby selectively forming an electrical path between the first node ND1 and a second node ND3. The third transistor N1 is turned on or off in response to a signal output from the third inverter I3, which inverts an output signal of the first NAND gate NG1, thereby selectively forming an electrical path between the second node ND3 and a third node ND5. The first NAND gate NG1 receives the second mode write command signal WREQ_SYNC, the second mode core operation pulse signal PCSLE, and the first signal BYP_ADD_SAME and performs a NAND operation on them. The fourth transistor N3 is turned on or off in response to the mode conversion set signal MRS_SETb, thereby selectively forming an electrical path between the third node ND5 and a second power supply voltage VSS. The fifth transistor P5 is turned on or off in response to a set signal PVCCHB, thereby selectively forming an electrical path between the first power supply voltage VDD and the second node ND3.

The set signal PVCCHB is at a second logic level (e.g., a low level) when the semiconductor memory device 10 is powered up and transits to a first logic level (e.g., a high level) after a predetermined period of time. The set signal PVCCHB may be a signal that enables the late write signal ASYNC_WT_OFF to the second logic level at the initial operation of the semiconductor memory device 10 so as to activate the late write operation of the peripheral circuit and that enables the bypass signal BYPASS to the first logic level so as to activate the bypass operation of the peripheral circuit.

The first transistor P1, the second transistor P3, and the fifth transistor P5 may be implemented by PMOS transistors.

The first latch circuit L1 latches a signal of the second node ND3. The fourth inverter I4 inverts an output signal of the first latch circuit L1 so as to output the bypass control signal BYP_ON. The fifth inverter I5 receives and inverts the bypass control signal BYP_ON so as to output the late write signal ASYNC_WT_OFF.

The bypass signal generator 30-3 generates the bypass signal BYPASS in response to the first signal BYP_ADD_SAME, the bypass control signal BYP_ON, and the bypass path control signal PBYPASS. The bypass signal generator 30-3 includes sixth through ninth inverts I6, I7, I8, and I9, a switch T1, a second latch circuit L3, and a second NAND gate NG3.

The sixth inverter I6 receives and inverts the first signal BYP_ADD_SAME. The seventh inverter I7 receives and inverts the bypass path control signal PBYPASS. The eighth inverter I8 receives and inverts an output signal of the seventh inverter I7. The switch T1 is turned on or off in response to an output signal of the seventh inverter I7 and an output signal of the eighth inverter I8, thereby selectively blocking an electrical path of an output signal of the sixth inverter I6. The second latch circuit L3 receives and latches the output signal of the sixth inverter I6. The second NAND gate NG3 receives the output signal of the sixth inverter I6 and the bypass control signal BYP_ON and performs a NAND operation on them. The ninth inverter I9 receives and inverts an output signal of the second NAND gate NG3 so as to output the bypass signal BYPASS.

Figure 3:
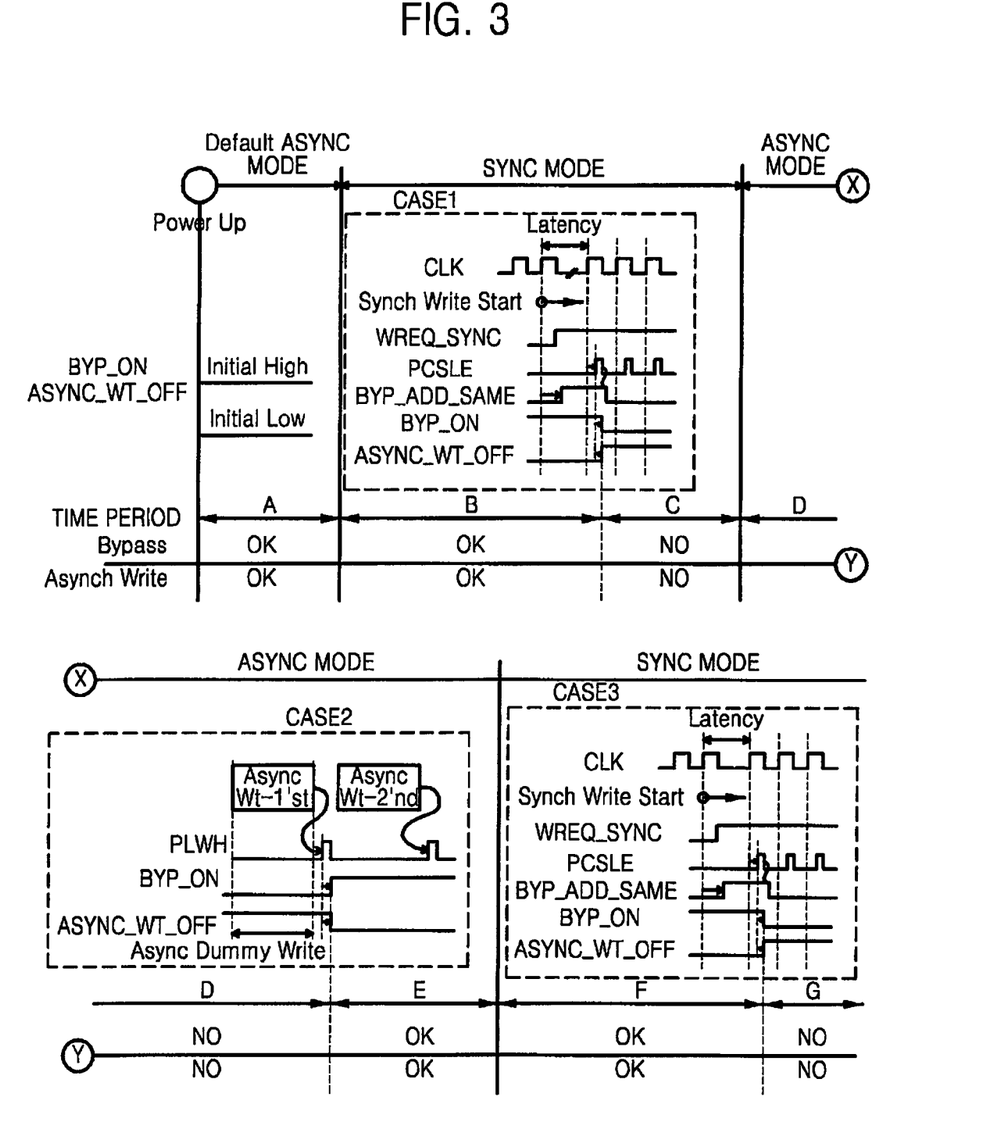
FIG. 3 is an operation timing chart of the bypass control unit illustrated in FIG. 2.

FIG. 3 is an operation timing chart of the bypass control unit 30 illustrated in FIG. 2. Here, it is assumed that the initial operation mode of the semiconductor memory device 10 illustrated in FIG. 1 is the first (ASYNC) mode. Referring to FIGS. 1 through 3, while the semiconductor memory device 10 operates in the first mode during a time period A (i.e., the initial operation period), the selection unit 22 performs the bypass operation in response to the bypass signal BYPASS at the first logic level (e.g., the high level). The write driver 18-2 performs the late write operation in response to the first pulse signal PDIOP at the second logic level (e.g., the low level), which is generated by the pulse generation unit 32 in response to the late write signal ASYNC_WT_OFF at the second logic level (or the low level).

In FIG. 3, "CASE1" is a timing chart illustrating waveform changes when the semiconductor memory device 10 transits from the first mode to the second mode. In the CASE1, a sync write start command which is a write command in the second mode starts from the controller and after a predetermined latency, the second mode write command signal WREQ_SYNC transits to the first logic level (or the high level). In addition, the first signal BYP_ADD_SAME, which is generated when a first address input together with the sync write start command is the same as a second address input following the first address after the semiconductor memory device 10 transits to the second mode, transits to the first logic level (or the high level) and the second mode core operation pulse signal PCSLE is generated. At this time, the bypass control signal BYP_ON transits to the second logic level (or the low level) and the late write signal ASYNC_WT_OFF transits to the first logic level (or the high level).

In other words, in a time period B, all of the second mode write command signal WREQ_SYNC, the second mode core operation pulse signal PCSLE, and the first signal BYP_ADD_SAME are not at the first logic level (or the high level), and therefore, the selection unit 22 performs the bypass operation in response to the bypass signal BYPASS at the first logic level (or the high level). In addition, in the period B, the write driver 18-2 performs the late write operation in response to the first pulse signal PDIOP at the second logic level (or the low level), which is generated by the pulse generation unit 32 in response to the late write signal ASYNC_WT_OFF at the second logic level (or the low level).

However, at the beginning of a time period C, all of the second mode write command signal WREQ_SYNC, the second mode core operation pulse signal PCSLE, and the first signal BYP_ADD_SAME are at the first logic level (or the high level), and therefore, the selection unit 22 does not perform the bypass operation in response to the bypass signal BYPASS at the second logic level (or the low level). In addition, in the period C, the write driver 18-2 does not perform the late write operation in response to the second pulse signal PSA at the first logic level (or the high level), which is generated by the pulse generation unit 32 in response to the late write signal ASYNC_WT_OFF at the first logic level (or the high level).

"CASE2" is a timing chart for explaining the changes of waveforms when the semiconductor memory device 10 transits from the second mode to the first mode. In the CASE2, when the third pulse signal PLWH which is generated when a first write command Async Wt-1'st ends after the semiconductor memory device 10 is converted from the second mode to the first mode is output from the pulse generator 32-3, the bypass control signal BYP_ON transits to the first logic level (or the high level) and the late write signal ASYNC_WT_OFF transits to the second logic level (or the low level).

In other words, in a time period D, the third pulse signal PLWH is not generated, and therefore, the selection unit 22 does not perform the bypass operation in response to the bypass control signal BYP_ON at the second logic level (or the low level). In addition, in the period D, the write driver 18-2 does not perform the late write operation in response to the first pulse signal PDIOP at the first logic level (or the high level), which is generated by the pulse generation unit 32 in response to the late write signal ASYNC_WT_OFF at the first logic level (or the high level). In the period D, an Async Dummy Write, in which the late write operation is not performed even in the first mode of the semiconductor memory device 10, occurs, which means that a first late write operation does not occur after the semiconductor memory device 10 transits from the second mode to the first mode.

Accordingly, data of a cell in the memory cell array 12, on which a write operation has been performed in the second mode, is prevented from being erased by a late write operation in the first mode. As a result, even when mode conversion occurs, data coherency is maintained.

In a time period E, the third pulse signal PLWH is generated and the selection unit 22 performs the bypass operation in response to the bypass control signal BYP_ON at the first logic level (or the high level). In addition, in the time period E, the write driver 18-2 performs the late write operation in response to the first pulse signal PDIOP at the second logic level (or the low level), which is generated by the pulse generation unit 32 in response to the late write signal ASYNC_WT_OFF at the second logic level (or the low level).

"CASE3" is a timing chart for explaining the changes of waveforms when the semiconductor memory device 10 transits from the first mode to the second mode and is the same or similar to the CASE1. Thus, a detailed description thereof will be omitted.

Figure 4:
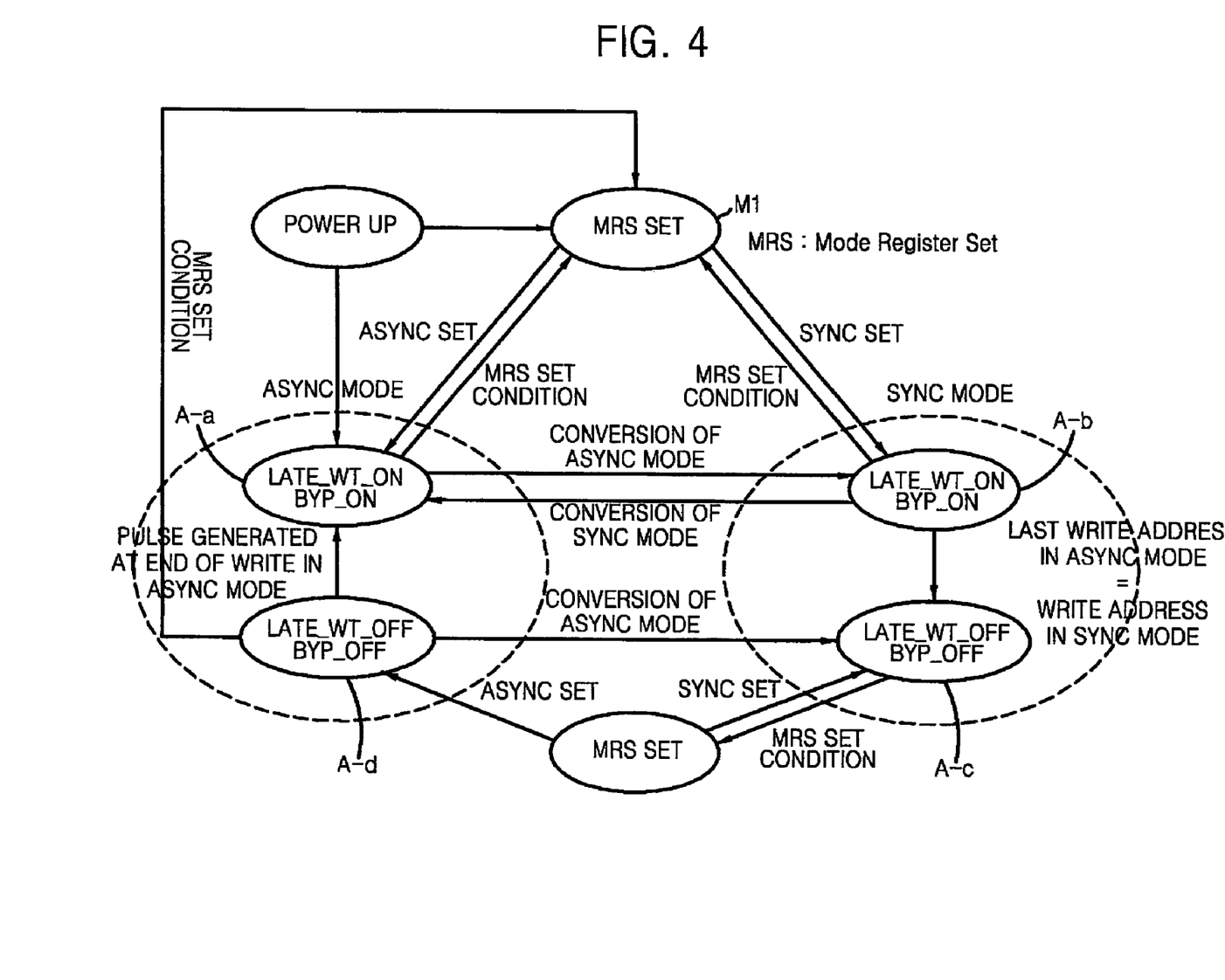
FIG. 4 is a state diagram illustrating a late write operation and a bypass operation when the semiconductor memory device illustrated in FIG. 1 changes mode.

FIG. 4 is a state diagram illustrating a late write operation and a bypass operation when the semiconductor memory device 10 illustrated in FIG. 1 changes mode. Here, it is assumed that the initial operation mode of the semiconductor memory device 10 is the first (ASYNC) mode. Referring to FIGS. 1 through 4, in a first state A-a of the first mode (e.g., an asynchronous mode), the selection unit 22 performs the bypass operation in response to the bypass control signal BYP_ON at the first logic level (or the high level), which is referred to as BYP_ON. In addition, the write driver 18-2 performs the late write operation in response to the first pulse signal PDIOP at the second logic level (or the low level), which is generated by the pulse generation unit 32 in response to the late write signal ASYNC_WT_OFF at the second logic level (or the low level), which is referred to as LATE_WT_ON.

When the mode of the semiconductor memory device 10 is converted from the first mode to the second mode by a mode conversion signal output from an MRS (not shown) or a mode conversion signal (e.g., a first mode signal ASYNC illustrated in FIG. 5), which is output from a mode controller 100 (FIG. 5), the semiconductor memory device 10 may transit from the first state A-a to a second state A-b or from a fourth state A-d to a third state A-c. The first state A-a, the second state A-b, the third state A-c, and the fourth state A-d respectively correspond to the time periods A, B, C, and D in FIG. 3.

When the semiconductor memory device 10 transits from the first state A-a to the second state A-b, the bypass operation of the selection unit 22 and the late write operation of the write driver 18-2 in the second state A-b are the same as those in the first state A-a. However, in the third state A-c (e.g., when a first address input together with a first write command in the first mode is the same as a second address input together with a second write command, i.e., a sync write start, input following the first address in the second mode after the semiconductor memory device 10 transits from the first mode to the second mode), the selection unit 22 does not perform the bypass operation, which is referred to as BYP_OFF, and the write driver 18-2 does not perform the late write operation, which is referred to as LATE_WT_OFF.

When the semiconductor memory device 10 transits from the second mode to the first mode by a mode conversion signal output from the MRS or a controller (not shown), the semiconductor memory device 10 may transit from the second state A-b to the first state A-a or from the third state A-c to the fourth state A-d. When the semiconductor memory device 10 transits from the third state A-c to the fourth state A-d, the bypass operation of the selection unit 22 and the late write operation of the write driver 1802 in the fourth state A-d are the same as those in the third state A-c. However, in the first state A-a (e.g., when the third pulse signal PLWH, which is generated at the end of the first write command Async Wt_1'st after the conversion from the second mode to the first mode, occurs), the selection unit 22 performs the bypass operation, which is referred to as BYP_ON, and the write driver 18-2 performs the late write operation, which is referred to as LATE_WT_ON.

Figure 5:
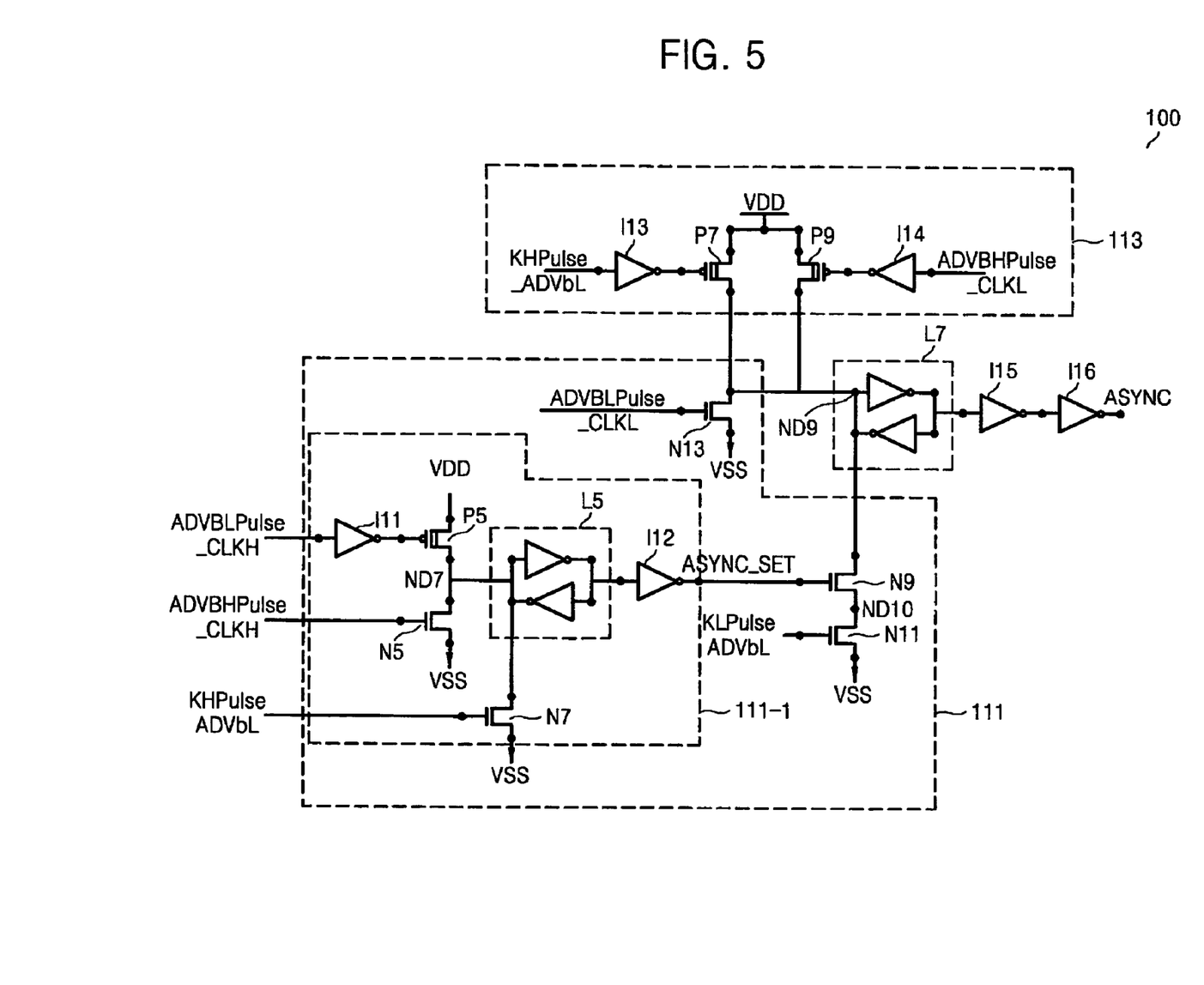
FIG. 5 is a circuit diagram of a mode controller according to some embodiments of the present invention.
Figure 6:
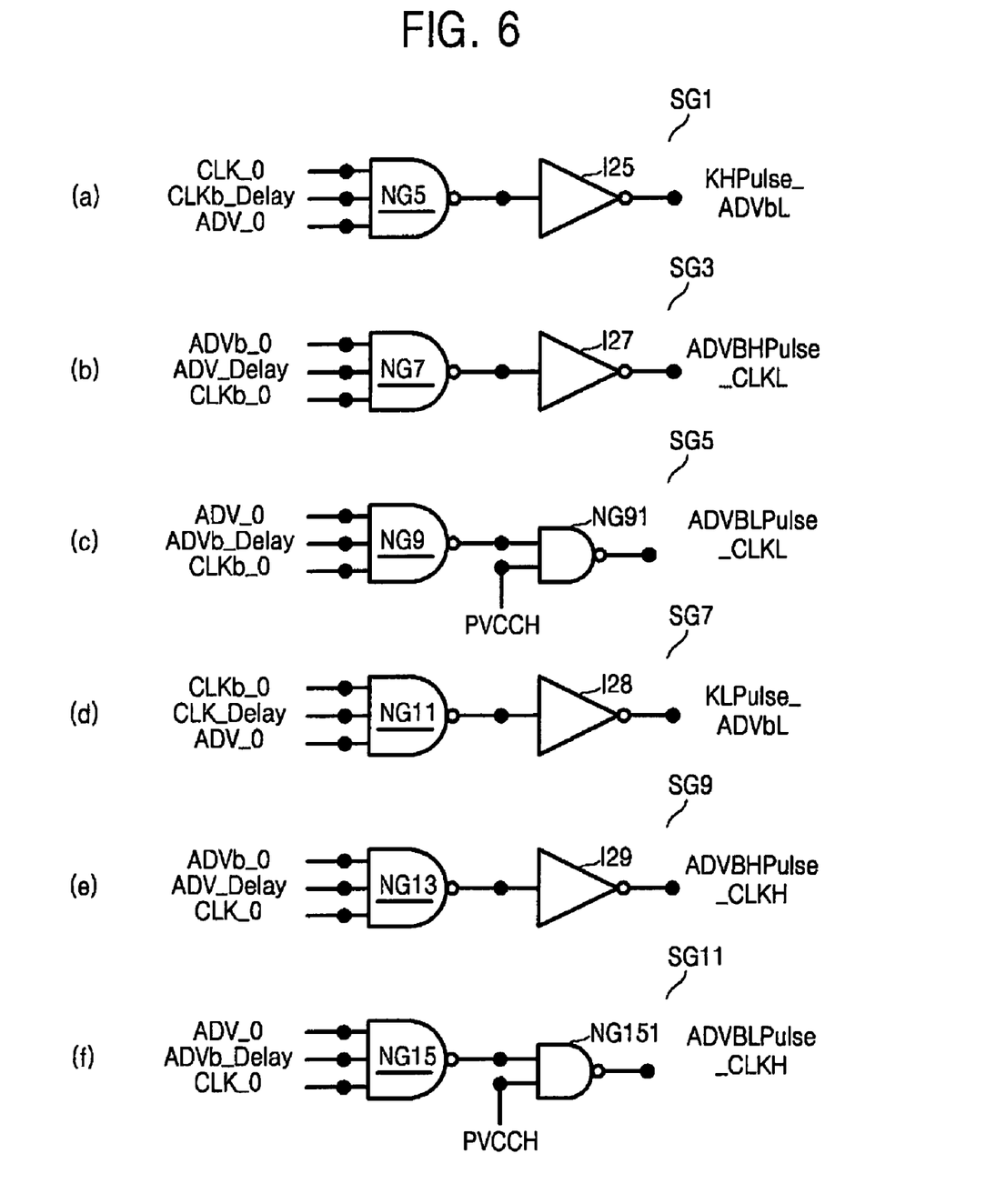
FIGS. 6(a) through (f) are circuit diagrams of signal generators according to some embodiments of the present invention.

FIG. 5 is a circuit diagram of the mode controller 100 according to some embodiments of the present invention. Referring to FIGS. 1 and 5, the semiconductor memory device 10 may further include the mode controller 100. The mode controller 100 operates the semiconductor memory device 10 in the first mode when a clock signal CLK does not toggle and operates the semiconductor memory device 10 in the second mode when the clock signal CLK toggles.

The mode controller 100 includes a first mode set block 111, a second mode set block 113, and a first latch L7. The first mode set block 111 enables the first mode signal ASYNC, which operates the semiconductor memory device 10 in the first mode, in response to corresponding signals among first group signals KHPulse_ADVbL and KLPulse_ADVbL and second group signals ADVBHPulse_CLKL, ADVBLPulse_CLKL, ADVBLPulse_CLKH, and ADVBHPulse_CLKH.

Each of the first group signals KHPulse_ADVbL and KLPulse_ADVbL may be a pulse signal that occurs at a rising or falling edge of one signal among the clock signal CLK, an inverted clock signal CLKb_0, delay clock signals CLK_0 and CLK_Delay obtained by sequentially delaying the clock signal CLK, and an inverted delay clock signal CLKb_Delay obtained by inverting the delay clock signal CLK_0, based on a corresponding signal among a command signal ADVb and an inverted command signal ADV_0, which are input in the first or second mode. Each of the second group signals ADVBHPulse_CLKL, ADVBLPulse_CLKL, ADVBLPulse_CLKH, and ADVBHPulse_CLKH may be a pulse signal that occurs at a rising or falling edge of one signal among the command signal ADVb, the inverted command signal ADV_0, delay command signals ADVb_0 and ADVb_Delay obtained by sequentially delaying the command signal ADVb, and an inverted delay command signal ADV_Delay obtained by inverting the delay command signal ADVb_0, in response to a corresponding signal among the clock signal CLK and the inverted clock signal CLKb_0.

The first group signals KHPulse_ADVbL and KLPulse_ADVbL and the second group signals ADVBHPulse_CLKL, ADVBLPulse_CLKL, ADVBLPulse_CLKH, and ADVBHPulse_CLKH will be described below with reference to FIGS. 6(a) through 7(b).

The first mode set block 111 includes a first mode set signal generator 111-1, a first transistor N9, a second transistor N11, and a third transistor N13. The first mode set signal generator 111-1 generates a first mode set signal ASYNC_SET enabling the first mode signal ASYNC in response to a first pulse ADVBLPulse_CLKH, a second pulse ADVBHPulse_CLKH, and a third pulse KHPulse_ADVbL. The first mode set signal generator 111-1 includes a first inverter I11, a fourth transistor P5, a fifth transistor N5, a second latch L5, a second inverter I12, and a sixth transistor N7.

The first inverter I11 receives and inverts the first pulse ADVBLPulse_CLKH. The fourth transistor P5 is turned on or off in response to an output signal of the first inverter I11 so as to selectively form an electrical path between a first power supply voltage VDD and a first node ND7. The fifth transistor N5 is turned on or off in response to the second pulse ADVBHPulse_CLKH so as to selectively form an electrical path between the first node ND7 and a second power supply voltage VSS. The second latch L5 is connected with the first node ND7 and latches a signal level of the first node ND7. The second inverter I12 receives and inverts an output signal of the second latch L5 so as to generate the first mode set signal ASYNC_SET. The sixth transistor N7 is turned on or off in response to the third pulse KHPulse_ADVbL so as to selectively form an electrical path between the first node ND7 and the second power supply voltage VSS.

The first transistor N9 is turned on or off in response to the first mode set signal ASYNC_SET so as to selectively form an electrical path between a second node ND9 and a third node ND10. The second transistor N11 is turned on or off in response to a fourth pulse KLPulse_ADVbL so as to selectively form an electrical path between the third node ND10 and the second power supply voltage VSS. The third transistor N13 is turned on or off in response to a fifth pulse signal ADVBLPulse_CLKL so as to selectively form an electrical path between the second node ND9 and second power supply voltage VSS.

The second mode set block 113 disenables the first mode signal ASYNC in response to corresponding signals among the first group signals KHPulse_ADVbL and KLPulse_ADVbL and the second group signals ADVBHPulse_CLKL, ADVBLPulse_CLKL, ADVBLPulse_CLKH, and ADVBHPulse_CLKH. The second mode set block 113 includes a third inverter I13, a seventh transistor P7, a fourth inverter I14, and an eighth transistor P9.

The third inverter I13 receives and inverts the third pulse KHPulse_ADVbL. The seventh transistor P7 is turned on or off in response to an output signal of the third inverter I13 so as to selectively form an electrical path between the first power supply voltage VDD and the second node ND9. The fourth inverter I14 receives and inverts a sixth pulse ADVBHPulse_CLKL. The eighth transistor P9 is turned on or off in response to an output signal of the fourth inverter I14 so as to selectively form an electrical path between the first power supply voltage VDD and the second node ND9.

The first latch L7 latches the voltage level of the second node ND9 and outputs the first mode signal ASYNC corresponding to a latched signal.

The mode controller 100 may further include a fifth inverter I15 and a sixth inverter I16. The fifth inverter I15 receives and inverts an output signal of the first latch L7. The sixth inverter I16 receives and inverts an output signal of the fifth inverter I15 so as to output the first mode signal ASYNC.

Figure 7:
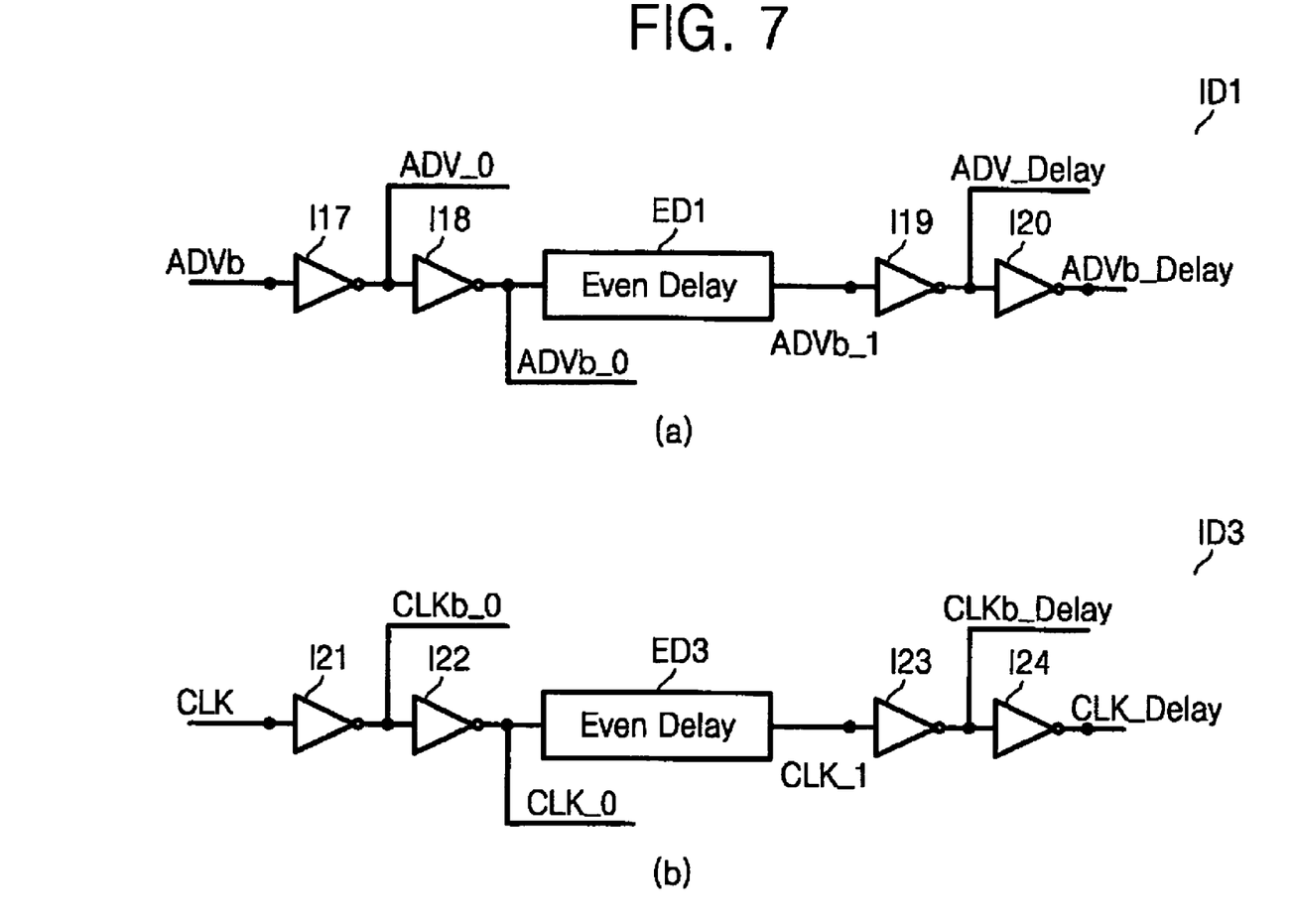

Referring to FIG. 1 and FIGS. 5 through 7(b), the semiconductor memory device 10 may further include first through sixth signal generators SG1, SG3, SG5, SG7, SG9, and SG11 respectively illustrated in FIGS. 6(a) through (f), a first inversion-delay circuit ID1 illustrated in FIG. 7(a), and a second inversion-delay circuit ID3 illustrated in FIG. 7(b).

The first signal generator SG1 generates the third pulse KHPulse_ADVbL based on the delay clock signal CLK_0, the inverted delay clock signal CLKb_Delay, and the inverted command signal ADV_0. The first signal generator SG1 includes a first NAND gate NG5 and a first inverter I25. The first NAND gate NG5 receives the delay clock signal CLK_0, the inverted delay clock signal CLKb_Delay, and the inverted command signal ADV_0 and performs a NAND operation on them. The first inverter I25 receives and inverts an output signal of the first NAND gate NG5 so as to output the third pulse KHPulse_ADVbL. Accordingly, the third pulse KHPulse_ADVbL corresponds to a signal that is triggered at a rising edge of the clock signal CLK while the command signal ADVb is at the second logic level (or the low level).

The second signal generator SG3 generates the sixth pulse ADVBHPulse_CLKL based on the delay command signal ADVb_0, the inverted delay command signal ADV_Delay, and the inverted clock signal CLKb_0. The second signal generator SG3 includes a second NAND gate NG7 and a second inverter I27. The second NAND gate NG7 receives the delay command signal ADVb_0, the inverted delay command signal ADV_Delay, and the inverted clock signal CLKb_0 and performs a NAND operation on them. The second inverter I27 receives and inverts an output signal of the second NAND gate NG7 so as to output the sixth pulse ADVBHPulse_CLKL. Accordingly, the sixth pulse ADVBHPulse_CLKL corresponds to a signal that is triggered at a rising edge of the command signal ADVb while the clock signal CLK is at the second logic level (or the low level).

The third signal generator SG5 generates the fifth pulse ADVBLPulse_CLKL based on the inverted command signal ADV_0, the delay command signal ADVb_Delay, the inverted clock signal CLKb_0, and an inverted set signal PVCCH. The third signal generator SG5 includes a third NAND gate NG9 and a fourth NAND gate NG91. The third NAND gate NG9 receives the inverted command signal ADV_0, the delay command signal ADVb_Delay, and the inverted clock signal CLKb_0 and performs a NAND operation on them. The fourth NAND gate NG91 generates the fifth pulse ADVBLPulse_CLKL based on an output signal of the third NAND gate NG9 and the inverted set signal PVCCH. Accordingly, the fifth pulse ADVBLPulse_CLKL corresponds to a signal that is triggered at a falling edge of the command signal ADVb while the clock signal CLK is at the second logic level (or the low level).

The fourth signal generator SG7 generates the fourth pulse KLPulse_ADVbL based on the inverted clock signal CLKb_0, the delay clock signal CLK_Delay, and the inverted command signal ADV_0. The fourth signal generator SG7 includes a fifth NAND gate NG11 and a third inverter I28. The fifth NAND gate NG11 receives the inverted clock signal CLKb_0, the delay clock signal CLK_Delay, and the inverted command signal ADV_0 and performs a NAND operation on them. The third inverter I28 receives and inverts an output signal of the fifth NAND gate NG11 so as to output the fourth pulse KLPulse_ADVbL. Accordingly, the fourth pulse KLPulse_ADVbL corresponds to a signal that is triggered at a falling edge of the clock signal CLK while the command signal ADVb is at the second logic level (or the low level).

The fifth signal generator SG9 generates the second pulse ADVBHPulse_CLKH based on the delay command signal ADVb_0, the inverted delay command signal ADV_Delay, and the delay clock signal CLK_0. The fifth signal generator SG9 includes a sixth NAND gate NG13 and a fourth inverter I29. The sixth NAND gate NG13 receives the delay command signal ADVb_0, the inverted delay command signal ADV_Delay, and the delay clock signal CLK_0 and performs a NAND operation on them. The fourth inverter I29 receives and inverts an output signal of the sixth NAND gate NG13 so as to output the second pulse ADVBHPulse_CLKH. Accordingly, the second pulse ADVBHPulse_CLKH corresponds to a signal that is triggered at a rising edge of the command signal ADVb while the clock signal CLK is at the first logic level (or the high level).

The sixth signal generator SG11 generates the first pulse ADVBLPulse_CLKH based on the inverted command signal ADV_0, the delay command signal ADVb_Delay, the delay clock signal CLK_0, and the inverted set signal PVCCH. The sixth signal generator SG11 includes a seventh NAND gate NG15 and an eighth NAND gate NG151. The seventh NAND gate NG15 receives the inverted command signal ADV_0, the delay command signal ADVb_Delay, and delay clock signal CLK_0 and performs a NAND operation on them. The eighth NAND gate NG151 generates the first pulse ADVBLPulse_CLKH based on an output signal of the seventh NAND gate NG15 and the inverted set signal PVCCH. Accordingly, the first pulse ADVBLPulse_CLKH corresponds to a signal that is triggered at a falling edge of the command signal ADVb while the clock signal CLK is at the first logic level (or the high level).

The signals input to the signal generators SG1 through SG11 may be generated by the first inversion-delay circuit ID1 (FIG. 7(a)) and the second inversion-delay circuit ID3 (FIG. 7(b)).

The first inversion-delay circuit ID1 includes a fifth inverter I17, a sixth inverter I18, a delay block ED1, a seventh inverter I19, and an eighth inverter I20. The fifth inverter I17 receives and inverts the command signal ADVb so as to output the inverted command signal ADV_0. The sixth inverter I18 receives and inverts the inverted command signal ADV_0 so as to output the first delay command signal ADVb_0. The delay block ED1 is implemented by an even number of inverters in a chain (not shown) and delays the first delay command signal ADVb_0 so as to output a second delay command signal ADVb_1. The seventh inverter I19 receives and inverts the second delay command signal ADVb_1 so as to output the inverted delay command signal ADV_Delay. The eighth inverter I20 receives and inverts the inverted delay command signal ADV_Delay so as to output a third delay command signal ADVb_Delay.

The second inversion-delay circuit ID3 includes a ninth inverter I21, a tenth inverter I22, a delay block ED3, an eleventh inverter I23, and a twelfth inverter I24. The ninth inverter I21 receives and inverts the clock signal CLK so as to output the inverted clock signal CLKb_0. The tenth inverter I22 receives and inverts the inverted clock signal CLKb_0 so as to output the first delay clock signal CLK_0. The delay block ED3 is implemented by an even number of inverters in a chain (not shown) and delays the first delay clock signal CLK_0 so as to output a second delay clock signal CLK_1. The eleventh inverter I23 receives and inverts the second delay clock signal CLK_1 so as to output the inverted delay clock signal CLKb_Delay. The twelfth inverter I24 receives and inverts the inverted delay clock signal CLKb_Delay so as to output a third delay clock signal CLK_Delay.

Figure 8:
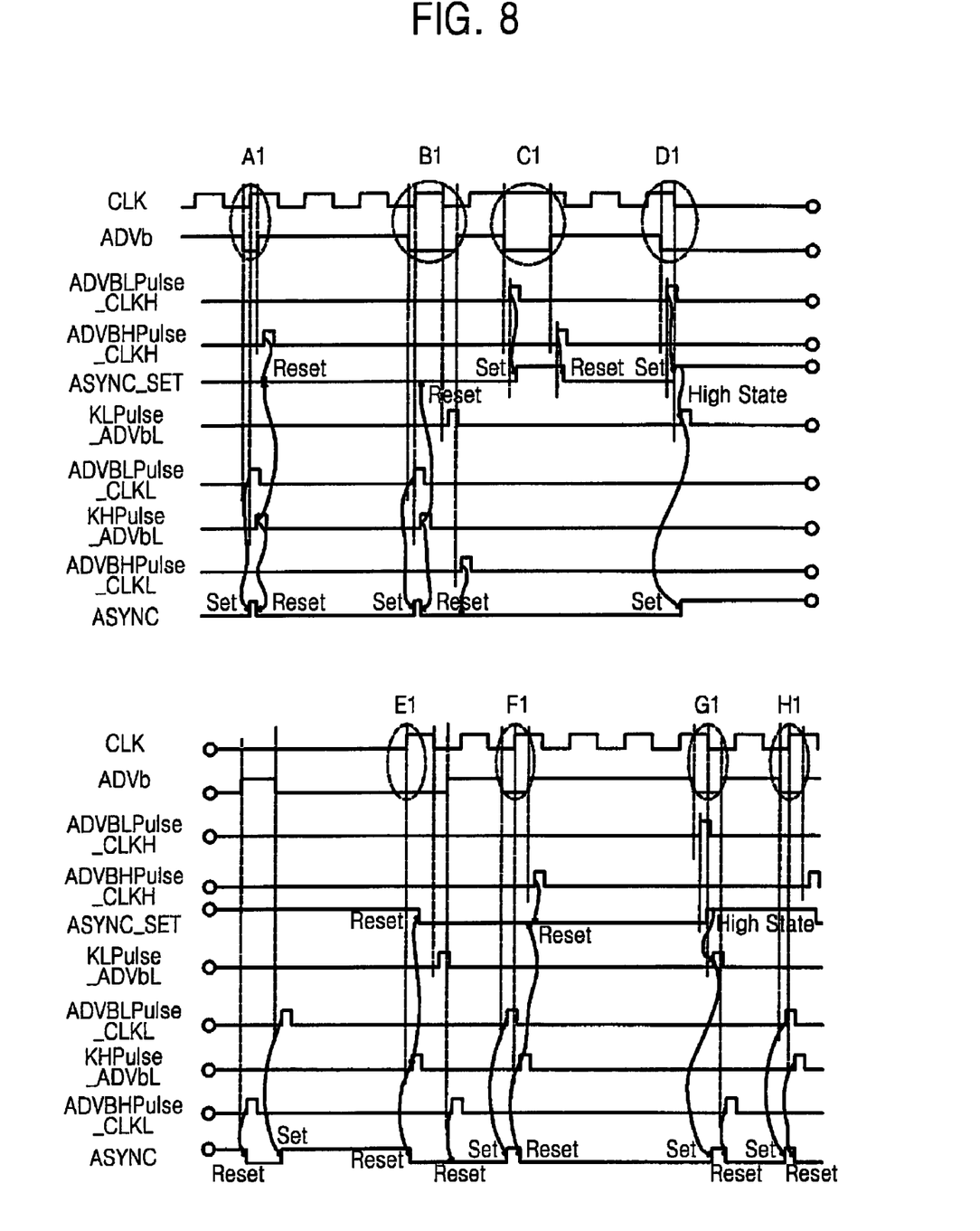
FIG. 8 is an operation timing chart of the mode controller illustrated in FIG.

FIG. 8 is an operation timing chart of the mode controller 100 illustrated in FIG. 5. Referring to FIG. 1 and FIGS. 6(a) through 8, a section A1 indicates that the second mode is performed normally when the command signal ADVb is input in synchronization with the clock signal CLK. For instance, at the section A1, the first mode signal ASYNC is enabled by the fifth pulse ADVBLPulse_CLKL, but the first mode set signal ASYNC_SET is maintained at the second logic level (or the low level) and the third pulse KHPulse_ADVbL transits to the first logic level (or the high level). Eventually, the first mode signal ASYNC is disabled and the second mode is maintained.

A section B1 indicates that the second mode is performed normally even if the second logic level (or the low level) of the command signal ADVb is continued over a single cycle of the clock signal CLK. For instance, at the section B1, the first mode signal ASYNC is enabled by the fifth pulse ADVBLPulse_CLKL, but the first mode set signal ASYNC_SET is maintained at the second logic level (or the low level) and the third pulse KHPulse_ADVbL transits to the first logic level (or the high level). Eventually, the first mode signal ASYNC is disabled and the second mode is maintained. In addition, the first mode signal ASYNC is disabled by the fourth pulse KLPulse_ADVbL and the sixth pulse ADVBHPulse_CLKL, which are generated by the command signal ADVb maintained at the second logic level (or the low level) over a single cycle of the clock signal CLK, and therefore, the second mode is maintained.

A section C1 indicates that the second mode is performed normally even if the command signal ADVb is input while the clock signal CLK is maintained at the first logic level (or the high level). For instance, at the section C1, the first mode set signal ASYNC_SET transits to the first logic level (or the high level) due to the first pulse ADVBLPulse_CLKH, but the first mode set signal ASYNC_SET transits again to the second logic level (or the low level) due to the second pulse ADVBHPulse_CLKH. As a result, the second mode is maintained.

A section D1 indicates that the first mode starts in response to the command signal ADVb having the first logic level (or the high level) during a high edge period of the last clock signal CLK in the second mode. For instance, at the section D1, the first mode signal ASYNC is enabled by the first mode set signal ASYNC_SET at the first logic level (or the high level), which is generated by the first pulse ADVBLPulse_CLKH, and the fourth pulse KLPulse_ADVbL, and therefore, the first mode starts.

A section E1 indicates that conversion from the first mode to the second mode is performed in response to toggling of the clock signal CLK. For instance, at the section E1, the first mode set signal ASYNC_SET transits to the second logic level (or the low level) due to the third pulse KHPulse_ADVbL and the first mode signal ASYNC is disabled, and therefore, the second mode starts.

A mode operation in a section F1 is the same as or similar to that in the section A1. Thus, a detailed description thereof will be omitted.

A section G1 indicates that the second mode is maintained even if the second mode might be interrupted because the command signal ADVb is input during a low edge period of the clock signal CLK in the second mode. For instance, even if the first mode signal ASYNC is enabled by the first mode set signal ASYNC_SET, which transits to the first logic level (or the high level) due to the first pulse ADVBLPulse_CLKH, and the fourth pulse KLPulse_ADVbL, the first mode signal ASYNC is disabled again by the sixth pulse ADVBHPulse_CLKL. As a result, the second mode is maintained.

A mode operation in a section H1 is the same as or similar to that in the section A1. Thus, a detailed description thereof will be omitted.

As described above, according to some embodiments of the present invention, a data coherency problem that may occur during mode conversion can be overcome using a late write signal and a bypass signal. In addition, since a mode conversion signal is generated just by toggling a clock signal, dummy cycle time that may occur during the mode conversion can be prevented.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A semiconductor memory device that operates in a first mode and a second mode, the semiconductor memory device comprising:
   a memory cell array comprising a plurality of memory cells arrayed in columns and rows in a matrix;
   a peripheral circuit coupled to the memory cell array and configured to write data to the memory cell array and to read data from the memory cell array; and
   a bypass control unit coupled to the peripheral unit, the bypass control unit configured to enable a late write operation and a bypass operation of the peripheral circuit when the semiconductor memory device operates in the first mode and to disable the late write operation and the bypass operation of the peripheral circuit when the semiconductor memory device operates in the second mode.

2. The semiconductor memory device of claim 1, wherein the first mode is an asynchronous operation mode and the second mode is a synchronous operation mode.

3. The semiconductor memory device of claim 1, wherein the peripheral circuit comprises:
   a row decoder coupled to the memory cell array and configured to select a row in the memory cell array;
   a column decoder coupled to the memory cell array and configured to select a column in the memory cell array;
   a register unit configured to store a first data in the first mode, the first data being input from outside the semiconductor memory device;
   a sensing/recording unit coupled to the column decoder and the register unit, the sensing/recording unit configured to sense and amplify a second data in the memory cell array, to read the first data from the register unit and write the first data to the memory cell array in response to a late write signal in the first mode, the late write signal enabling the late write operation, the sensing/recording unit further configured to write a third data input from outside the semiconductor memory device to the memory cell array regardless of the late write signal in the second mode; and
   a selection unit coupled to the sensing/recording unit and configured to output a selected one of the first data stored in the register unit and the second data output from the sensing/recording unit in response to a bypass signal, the bypass signal enabling the bypass operation.

4. The semiconductor memory device of claim 3, wherein the bypass control unit comprises:
   a late write signal generator configured to output the late write signal and a bypass control signal, the bypass control signal disabling the bypass signal, the late write signal generator configured to operate in response to a second mode write command signal, a first signal, and a second mode core operation pulse signal, which are input in the second mode; and a bypass signal generator configured to generate the bypass signal in response to the first signal and the bypass control signal, wherein the first signal is generated when a first address, which is input together with a write command in the first mode of the semiconductor memory device, is the same as a second address, which is input following the first address after the semiconductor memory device is converted to the second mode.

5. The semiconductor memory device of claim 4, further comprising an address comparison unit configured to compare the first address with the second address and to enable the first signal based on a result of the comparison.

6. The semiconductor memory device of claim 4, wherein the late write signal generator enables the late write signal in response to a first pulse signal when the semiconductor memory device transits from the second mode to the first mode, wherein the first pulse signal is generated when a write command ends after the semiconductor memory device transits from the second mode to the first mode.

7. The semiconductor memory device of claim 4, wherein the late write signal generator comprises a latch circuit configured to latch the late write signal and the bypass control signal.

8. The semiconductor memory device of claim 4, wherein the bypass signal generator comprises:
a latch circuit configured to latch the first signal; and
an output portion configured to output the bypass signal in response to the latched first signal and the bypass control signal.

9. The semiconductor memory device of claim 1, further comprising a mode controller configured to operate the semiconductor memory device in the first mode when a clock signal does not toggle and to operate the semiconductor memory device in the second mode when the clock signal toggles.

10. The semiconductor memory device of claim 9, wherein the mode controller comprises:
a first mode set block configured to enable a first mode signal, which operates the semiconductor memory device in the first mode, in response to corresponding signals among first group signals and second group signals;
a second mode set block configured to disable the first mode signal in response to corresponding signals among the first group signals and the second group signals; and
a latch configured to latch the first mode signal,
wherein each of the first group signals is a pulse signal generated at a rising or falling edge of the clock signal based on a command signal and each of the second group signals is a pulse signal generated at a rising or falling edge of the command signal based on the clock signal.

11. The semiconductor memory device of claim 10, further comprising a signal generator configured to generate the command signal, to generate an inverted command signal, delay command signals, and inverted delay command signals based on the command signal, to generate the clock signal, and to generate an inverted clock signal, delay clock signals, and inverted delay clock signals based on the clock signal.

12. A data input/output method of a semiconductor memory device operating in a first mode and a second mode, the data input/output method comprising:

outputting a late write signal and a bypass control signal in response to a second mode write command signal, a first signal, and a clock signal, which are input in the second mode; and
generating the bypass signal in response to the first signal and the bypass control signal,
wherein the late write signal enables a late write operation when data is input, the bypass signal enables a bypass operation when data is output, and the first signal is generated when a first address, which is input together with a write command in the first mode of the semiconductor memory device, is the same as a second address, which is input following the first address after the semiconductor memory device is converted to the second mode.

13. The data input/output method of claim 12, wherein the first mode is an asynchronous operation mode and the second mode is a synchronous operation mode.

14. The data input/output method of claim 12, further comprising, before outputting the late write signal and the bypass control signal, comparing the first address with the second address and enabling the first signal based on a result of the comparison.

15. The data input/output method of claim 12, wherein the outputting the late write signal and the bypass control signal comprises enabling the late write signal in response to a first pulse signal when the semiconductor memory device transits from the second mode to the first mode,
wherein the first pulse signal is generated when a first write command ends after the semiconductor memory device transits from the second mode to the first mode.

16. The data input/output method of claim 12, further comprising operating the semiconductor memory device in the first mode when a clock signal does not toggle and operating the semiconductor memory device in the second mode when the clock signal toggles.

17. The data input/output method of claim 16, wherein the operating the semiconductor memory device in the first mode when the clock signal does not toggle and in the second mode when the clock signal toggles comprises:
generating a set signal, which operates the semiconductor memory device in the first mode, in response to corresponding signals among first group signals and second group signals;
operating the semiconductor memory device in the second mode in response to corresponding signals among the first group signals and the second group signals; and
latching the set signal or a reset signal,
wherein each of the first group signals is a pulse signal generated at a rising or falling edge of the clock signal based on a command signal and each of the second group signals is a pulse signal generated at a rising or falling edge of the command signal based on the clock signal.

18. The data input/output method of claim 17, further comprising:
generating the command signal;
generating an inverted command signal, delay command signals, and inverted delay command signals based on the command signal;
generating the clock signal; and
generating an inverted clock signal, delay clock signals, and inverted delay clock signals based on the clock signal.

* * * * *